United States Patent
Komasaki

(10) Patent No.: US 10,613,161 B2
(45) Date of Patent: *Apr. 7, 2020

(54) MAGNETIC SENSOR INCLUDING TWO BIAS MAGNETIC FIELD GENERATION UNITS FOR GENERATING STABLE BIAS MAGNETIC FIELD

(71) Applicant: TDK CORPORATION, Tokyo (JP)

(72) Inventor: Yosuke Komasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 91 days.

This patent is subject to a terminal disclaimer.

(21) Appl. No.: 15/887,147

(22) Filed: Feb. 2, 2018

(65) Prior Publication Data

US 2018/0180685 A1    Jun. 28, 2018

Related U.S. Application Data

(63) Continuation of application No. 14/978,660, filed on Dec. 22, 2015, now Pat. No. 9,921,275.

(30) Foreign Application Priority Data

Mar. 23, 2015    (JP) .................................. 2015-059394

(51) Int. Cl.
| | | |
|---|---|---|
| G01R 31/00 | (2006.01) | |
| G01R 33/038 | (2006.01) | |
| G01R 33/09 | (2006.01) | |
| H01F 7/02 | (2006.01) | |

(52) U.S. Cl.
CPC ........... *G01R 33/038* (2013.01); *G01R 33/09* (2013.01); *G01R 33/093* (2013.01); *H01F 7/0273* (2013.01)

(58) Field of Classification Search
USPC ................... 324/252, 246, 247, 249, 207.21
See application file for complete search history.

(56) References Cited

U.S. PATENT DOCUMENTS

| | | |
|---|---|---|
| 9,099,123 B1 | 8/2015 | Wagatsuma et al. |
| 9,244,136 B2 | 1/2016 | Yamazaki et al. |
| 2002/0036878 A1 | 3/2002 | Umetsu |
| 2014/0292322 A1 | 10/2014 | Yamazaki et al. |

FOREIGN PATENT DOCUMENTS

| | | |
|---|---|---|
| JP | 2009-042105 A | 2/2009 |
| JP | 2014-062738 A | 4/2014 |

OTHER PUBLICATIONS

Aug. 4, 2017 Office Action Issued in U.S. Appl. No. 14/978,660.
Nov. 3, 2017 Notice of Allowance issued in U.S. Appl. No. 14/978,660.

*Primary Examiner* — Vincent Q Nguyen
(74) *Attorney, Agent, or Firm* — Oliff PLC

(57) ABSTRACT

A magnetic sensor includes an MR element and two stacks. The two stacks are spaced apart from each other along a first direction. Each stack includes a ferromagnetic layer and an antiferromagnetic layer stacked along a second direction orthogonal to the first direction. An element placement region is formed between the two stacks when viewed in the second direction. The element placement region includes a middle region and two end regions. The MR element is placed to lie within the middle region.

6 Claims, 9 Drawing Sheets

MAGNETIC SENSOR INCLUDING TWO BIAS MAGNETIC FIELD GENERATION UNITS FOR GENERATING STABLE BIAS MAGNETIC FIELD

This application is a continuation application of U.S. patent application Ser. No. 14/978,660 filed Dec. 22, 2015, which claims the benefit of Japanese Patent Application No. 2015-059394 filed Mar. 23, 2015. The disclosure of prior applications is hereby incorporated by reference herein in their entirety.

BACKGROUND OF THE INVENTION

1. Field of the Invention

The present invention relates to a magnetic sensor including a magnetic detection element and two bias magnetic field generation units, the two bias magnetic field generation units being configured to cooperate with each other to generate a bias magnetic field to be applied to the magnetic detection element.

2. Description of the Related Art

In recent years, magnetic sensor systems have been employed to detect a physical quantity associated with the rotational movement or linear movement of a moving object in a variety of applications. Typically, a magnetic sensor system includes a scale and a magnetic sensor, and the magnetic sensor is configured to generate a signal associated with the relative positional relationship between the scale and the magnetic sensor.

The magnetic sensor includes a magnetic detection element for detecting a magnetic field to be detected. Hereinafter, the magnetic field to be detected will be referred to as the target magnetic field. U.S. Patent Application Publication No. 2014/0292322 A1 discloses a magnetic sensor that uses a so-called spin-valve magnetoresistance (MR) element as the magnetic detection element. The spin-valve MR element includes a magnetization pinned layer having a magnetization pinned in a certain direction, a free layer having a magnetization that varies depending on the target magnetic field, and a nonmagnetic layer located between the magnetization pinned layer and the free layer. Examples of the spin-valve MR element include a TMR element in which the nonmagnetic layer is a tunnel barrier layer, and a GMR element in which the nonmagnetic layer is a nonmagnetic conductive layer.

Some magnetic sensors have means for applying a bias magnetic field to the magnetic detection element. The bias magnetic field is used to allow the magnetic detection element to respond linearly to a variation in the strength of the target magnetic field. In a magnetic sensor that uses a spin-valve MR element, the bias magnetic field is used also to make the free layer have a single magnetic domain and to orient the magnetization of the free layer in a certain direction, when there is no target magnetic field.

U.S. Patent Application Publication No. 2014/0292322 A1 discloses a magnetic sensor including a spin-valve MR element, and a pair of permanent magnets for generating a bias magnetic field. The pair of permanent magnets are opposed to each other with the MR element therebetween.

Magnetic sensors that use a pair of permanent magnets as the means for generating a bias magnetic field, such as those disclosed in U.S. Patent Application Publication No. 2014/0292322 A1, have the following problems. Such magnetic sensors are typically used under the condition that the strength of the target magnetic field does not exceed the coercivity of the permanent magnets. However, since the magnetic sensors can be used in various environments, an external magnetic field having a strength exceeding the coercivity of the permanent magnets can happen to be temporarily applied to the permanent magnets. When such an external magnetic field is temporarily applied to the permanent magnets, the magnetization direction of the permanent magnets may be changed from an original direction and then remain different from the original direction even after the external magnetic field disappears. In such a case, the direction of the bias magnetic field differs from a desired direction.

OBJECT AND SUMMARY OF THE INVENTION

It is an object of the present invention to provide a magnetic sensor that allows application of a stable bias magnetic field to a magnetic detection element.

A magnetic sensor of the present invention includes: at least one magnetic detection element for detecting a target magnetic field; and a first bias magnetic field generation unit and a second bias magnetic field generation unit configured to cooperate with each other to generate a bias magnetic field to be applied to the at least one magnetic detection element. The first bias magnetic field generation unit and the second bias magnetic field generation unit are spaced a predetermined distance apart from each other along a first direction. Each of the first and second bias magnetic field generation units includes a ferromagnetic layer and a first antiferromagnetic layer stacked along a second direction orthogonal to the first direction. The ferromagnetic layer has a first surface and a second surface located at opposite ends in the second direction. The first antiferromagnetic layer is in contact with the first surface of the ferromagnetic layer and exchange-coupled to the ferromagnetic layer.

Each of the first and second bias magnetic field generation units has a first end and a second end opposite to each other in a third direction orthogonal to both of the first direction and the second direction. Here, a first imaginary straight line and a second imaginary straight line are defined in an imaginary plane perpendicular to the second direction and intersecting the at least one magnetic detection element. The first imaginary straight line passes through the first end of each of the first and second bias magnetic field generation units when viewed in the second direction. The second imaginary straight line passes through the second end of each of the first and second bias magnetic field generation units when viewed in the second direction. In the magnetic sensor of the present invention, the first and second bias magnetic field generation units are positioned to define an element placement region in the imaginary plane. The element placement region is located between the first bias magnetic field generation unit and the second bias magnetic field generation unit when viewed in the second direction, and between the first imaginary straight line and the second imaginary straight line.

The element placement region includes a first end region, a second end region and a middle region each of which has an area. The first end region is located closer to the first imaginary straight line than is the middle region. The second end region is located closer to the second imaginary straight line than is the middle region. The middle region is located between the first end region and the second end region, borders on the first end region along a first border line parallel to the first imaginary straight line, and borders on the second end region along a second border line parallel to the second imaginary straight line. The at least one magnetic detection element is placed such that the entirety of the at least one magnetic detection element lies within the middle region in the imaginary plane.

In the magnetic sensor of the present invention, the ferromagnetic layer may have a magnetization in a direction parallel to the first direction. The bias magnetic field at a location where the at least one magnetic detection element is placed may contain a component in the same direction as the magnetization of the ferromagnetic layer.

In the magnetic sensor of the present invention, the distance between the first imaginary straight line and the first border line, and the distance between the second imaginary straight line and the second border line may both be 30% of the distance between the first bias magnetic field generation unit and the second bias magnetic field generation unit.

In the magnetic sensor of the present invention, the imaginary plane may intersect the first and second bias magnetic field generation units.

In the magnetic sensor of the present invention, the at least one magnetic detection element may be at least one magnetoresistance element. The at least one magnetoresistance element may include a magnetization pinned layer having a magnetization pinned in a certain direction, a free layer having a magnetization that varies depending on the target magnetic field, and a nonmagnetic layer located between the magnetization pinned layer and the free layer. The magnetization pinned layer, the nonmagnetic layer and the free layer may be stacked along the second direction. The imaginary plane may intersect the ferromagnetic layer of each of the first and second bias magnetic field generation units and the free layer of the at least one magnetoresistance element.

In the magnetic sensor of the present invention, each of the first and second bias magnetic field generation units may further include a second antiferromagnetic layer that is in contact with the second surface of the ferromagnetic layer and exchange-coupled to the ferromagnetic layer.

In each of the first and second bias magnetic field generation units of the magnetic sensor of the present invention, the direction of the magnetization of the ferromagnetic layer is determined by the exchange coupling between the first antiferromagnetic layer and the ferromagnetic layer. In each of the first and second bias magnetic field generation units, even if an external magnetic field having a high strength sufficient to reverse the direction of the magnetization of the ferromagnetic layer is temporarily applied, the direction of the magnetization of the ferromagnetic layer returns to an original direction upon disappearance of such an external magnetic field. Thus, the magnetic sensor of the present invention allows application of a stable bias magnetic field to the magnetic detection element.

Other and further objects, features and advantages of the present invention will appear more fully from the following description.

DETAILED DESCRIPTION OF THE PREFERRED EMBODIMENTS

First Embodiment

Figure 1:
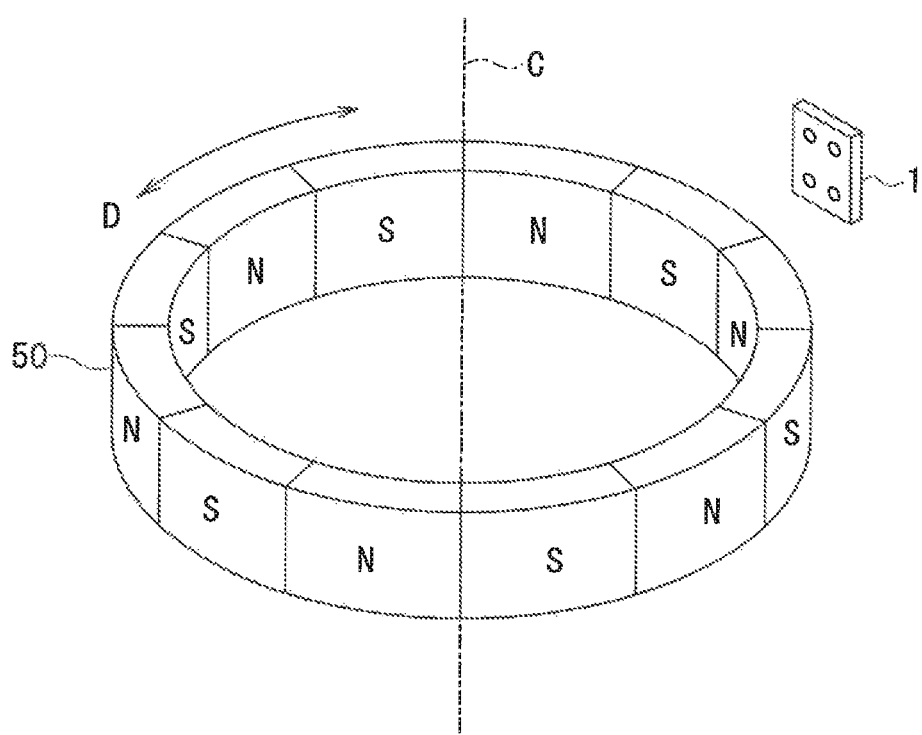
FIG. 1 is a perspective view illustrating the general configuration of a magnetic sensor system of a first embodiment of the invention.

Preferred embodiments of the present invention will now be described in detail with reference to the drawings. First, reference is made to FIG. 1 to describe an example of a magnetic sensor system including a magnetic sensor according to a first embodiment of the invention. FIG. 1 is a perspective view illustrating the general configuration of the magnetic sensor system of the first embodiment. The magnetic sensor system shown in FIG. 1 includes the magnetic sensor 1 according to the first embodiment, and a rotation scale 50 for generating a target magnetic field, i.e., a magnetic field to be detected by the magnetic sensor 1. In response to a rotational movement of a moving object (not illustrated), the rotation scale 50 rotates about a predetermined central axis C in a rotational direction D. The relative positional relationship between the rotation scale 50 and the magnetic sensor 1 is thereby changed in the rotational direction D. The magnetic sensor system detects a physical quantity associated with the relative positional relationship between the rotation scale 50 and the magnetic sensor 1. More specifically, the magnetic sensor system detects, as the aforementioned physical quantity, the rotational position and/or the rotational speed of the aforementioned moving body moving with the rotation scale 50.

As shown in FIG. 1, the rotation scale 50 is a multiple-magnetized magnet having a plurality of pairs of N and S poles alternately arranged in a circumferential direction. In the example shown in FIG. 1, the rotation scale 50 has six pairs of N and S poles. The magnetic sensor 1 is placed to face the outer circumferential surface of the rotation scale 50.

The direction of the target magnetic field varies periodically with varying relative positional relationship between the rotation scale 50 and the magnetic sensor 1. In the first embodiment, the direction of the target magnetic field changes as the rotation scale 50 rotates. In the example shown in FIG. 1, one rotation of the rotation scale 50 causes the direction of the target magnetic field to rotate six times, that is, to change by six periods.

Figure 2:
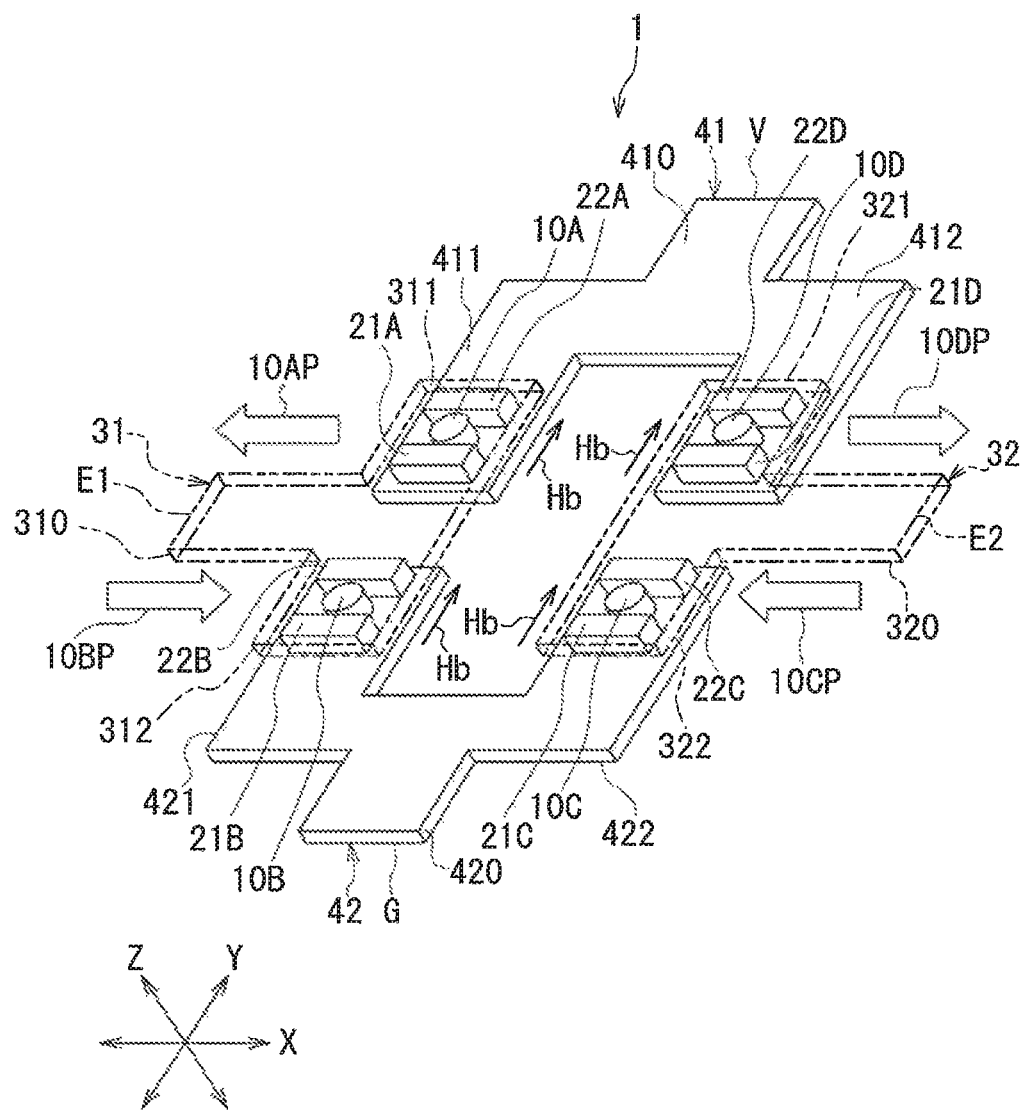
FIG. 2 is a perspective view of a magnetic sensor according to the first embodiment of the invention.
Figure 3:
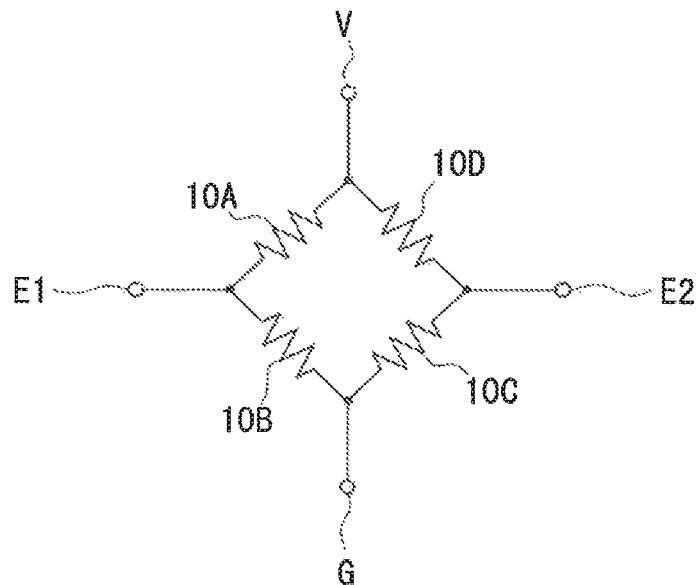
FIG. 3 is a circuit diagram of the magnetic sensor according to the first embodiment of the invention.

The magnetic sensor 1 will now be described with reference to FIG. 2 and FIG. 3. FIG. 2 is a perspective view of the magnetic sensor 1. FIG. 3 is a circuit diagram of the magnetic sensor 1. The magnetic sensor 1 includes at least one magnetic detection element for detecting the target magnetic field, and a first bias magnetic field generation unit and a second bias magnetic field generation unit configured to cooperate with each other to generate a bias magnetic field to be applied to the at least one magnetic detection element. In the first embodiment, the at least one magnetic detection element is at least one magnetoresistance (MR) element.

In the first embodiment, the magnetic sensor 1 includes four MR elements 10A, 10B, 10C and 10D, in particular, as the at least one MR element. The magnetic sensor 1 further includes, as the first and second bias magnetic field generation units, four pairs of first and second bias magnetic field generation units (21A, 22A), (21B, 22B), (21C, 22C) and (21D, 22D) corresponding to the MR elements 10A, 10B, 10C and 10D, respectively. The four pairs of first and second bias magnetic field generation units (21A, 22A), (21B, 22B), (21C, 22C) and (21D, 22D) generate respective bias magnetic fields to be applied to the corresponding MR elements 10A, 10B, 10C and 10D.

The first bias magnetic field generation unit 21A and the second bias magnetic field generation unit 22A are spaced a predetermined distance apart from each other along a first direction with the MR element 10A interposed therebetween. Now, X, Y and Z directions are defined as shown in FIG. 2. The X, Y and Z directions are orthogonal to one another. In the first embodiment, the first direction is the Y direction.

As used herein, each of the X, Y and Z directions is defined as including one particular direction and the opposite direction thereto, as indicated by the respective double-headed arrows in FIG. 2. On the other hand, the direction of any magnetic field or magnetization is defined as indicating a single particular direction.

Like the positional relationship between the MR element 10A and the first and second bias magnetic field generation units 21A and 22A described above, the first bias magnetic field generation unit 21B and the second bias magnetic field generation unit 22B are spaced a predetermined distance apart from each other along the first direction (Y direction) with the MR element 10B interposed therebetween. The first bias magnetic field generation unit 21C and the second bias magnetic field generation unit 22C are spaced a predetermined distance apart from each other along the first direction (Y direction) with the MR element 10C interposed therebetween. The first bias magnetic field generation unit 21D and the second bias magnetic field generation unit 22D are spaced a predetermined distance apart from each other along the first direction (Y direction) with the MR element 10D interposed therebetween.

The magnetic sensor 1 further includes a substrate (not illustrated), two upper electrodes 31 and 32, and two lower electrodes 41 and 42. The lower electrodes 41 and 42 are placed on the non-illustrated substrate. The upper electrode 31 has a base part 310, and two branch parts 311 and 312 branching off from the base part 310. The upper electrode 32 has a base part 320, and two branch parts 321 and 322 branching off from the base part 320. The lower electrode 41 has a base part 410, and two branch parts 411 and 412 branching off from the base part 410. The lower electrode 42 has a base part 420, and two branch parts 421 and 422 branching off from the base parts 420. The branch part 311 of the upper electrode 31 is opposed to the branch part 411 of the lower electrode 41. The branch part 312 of the upper electrode 31 is opposed to the branch part 421 of the lower electrode 42. The branch part 321 of the upper electrode 32 is opposed to the branch part 412 of the lower electrode 41. The branch part 322 of the upper electrode 32 is opposed to the branch part 422 of the lower electrode 42.

The MR element 10A and the bias magnetic field generation units 21A and 22A are located between the branch part 411 of the lower electrode 41 and the branch part 311 of the upper electrode 31. The upper electrode 31 and the lower electrode 41 are located on opposite sides of the MR element 10A in the Z direction, and supply current to the MR element 10A.

The MR element 10B and the bias magnetic field generation units 21B and 22B are located between the branch part 421 of the lower electrode 42 and the branch part 312 of the upper electrode 31. The upper electrode 31 and the lower electrode 42 are located on opposite sides of the MR element 10B in the Z direction, and supply current to the MR element 10B.

The MR element 10C and the bias magnetic field generation units 21C and 22C are located between the branch part 422 of the lower electrode 42 and the branch part 322 of the upper electrode 32. The upper electrode 32 and the lower electrode 42 are located on opposite sides of the MR element 10C in the Z direction, and supply current to the MR element 10C.

The MR element 10D and the bias magnetic field generation units 21D and 22D are located between the branch part 412 of the lower electrode 41 and the branch part 321 of the upper electrode 32. The upper electrode 32 and the lower electrode 41 are located on opposite sides of the MR element 10D in the Z direction, and supply current to the MR element 10D.

As shown in FIG. 2, the base part 310 of the upper electrode 31 includes a first output port E1. The base part 320 of the upper electrode 32 includes a second output port E2. The base part 410 of the lower electrode 41 includes a power supply port V. The base part 420 of the lower electrode 42 includes a ground port G.

The MR element 10A and the MR element 10B are connected in series via the upper electrode 31. The MR element 10C and the MR element 10D are connected in series via the upper electrode 32.

As shown in FIG. 3, one end of the MR element 10A is connected to the power supply port V. The other end of the MR element 10A is connected to the first output port E1. One end of the MR element 10B is connected to the first output port E1. The other end of the MR element 10B is connected to the ground port G. The MR elements 10A and 10B constitute a half-bridge circuit. One end of the MR element 10C is connected to the second output port E2. The other end of the MR element 10C is connected to the ground port G. One end of the MR element 10D is connected to the power supply port V. The other end of the MR element 10D is connected to the second output port E2. The MR elements 10C and 10D constitute a half-bridge circuit. The MR elements 10A, 10B, 10C and 10D constitute a Wheatstone bridge circuit.

A power supply voltage of a predetermined magnitude is applied to the power supply port V1. The ground port G is grounded. Each of the MR elements 10A, 10B, 10C and 10D varies in resistance depending on the target magnetic field. The resistances of the MR elements 10A and 10C vary in phase with each other. The resistances of the MR elements 10B and 10D vary 180° out of phase with the resistances of the MR elements 10A and 10C. The first output port E1 outputs a first detection signal corresponding to the potential at the connection point between the MR elements 10A and 10B. The second output port E2 outputs a second detection signal corresponding to the potential at the connection point between the MR elements 10D and 10C. The first and second detection signals vary depending on the target magnetic field. The second detection signal is 180° out of phase with the first detection signal. The magnetic sensor 1 generates an output signal by computation including determining the difference between the first detection signal and the second detection signal. For example, the output signal of the magnetic sensor 1 is generated by adding a predetermined offset voltage to a signal obtained by subtracting the second detection signal from the first detection signal. The output signal of the magnetic sensor 1 varies depending on the target magnetic field.

Figure 4:
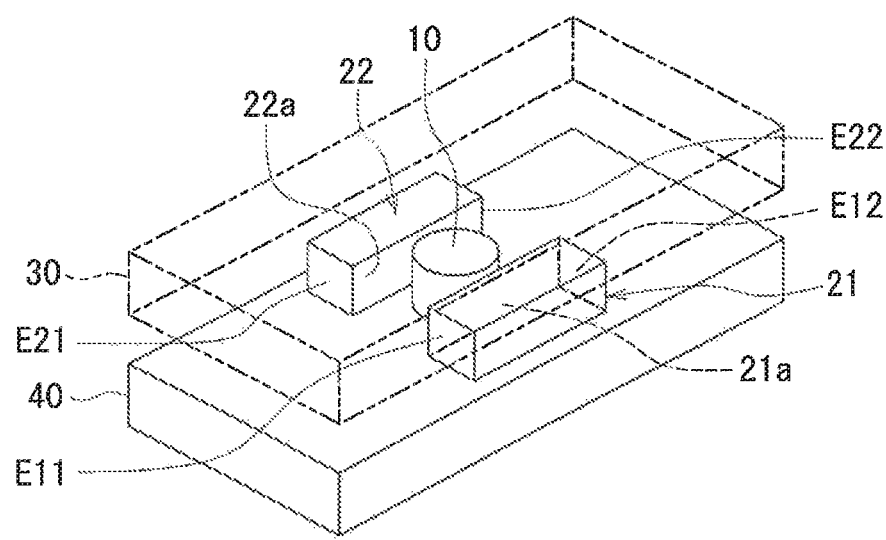
FIG. 4 is an enlarged perspective view of a portion of the magnetic sensor shown in FIG. 2.
Figure 4:
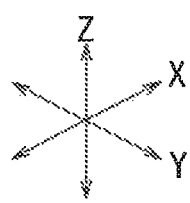
Figure 5:
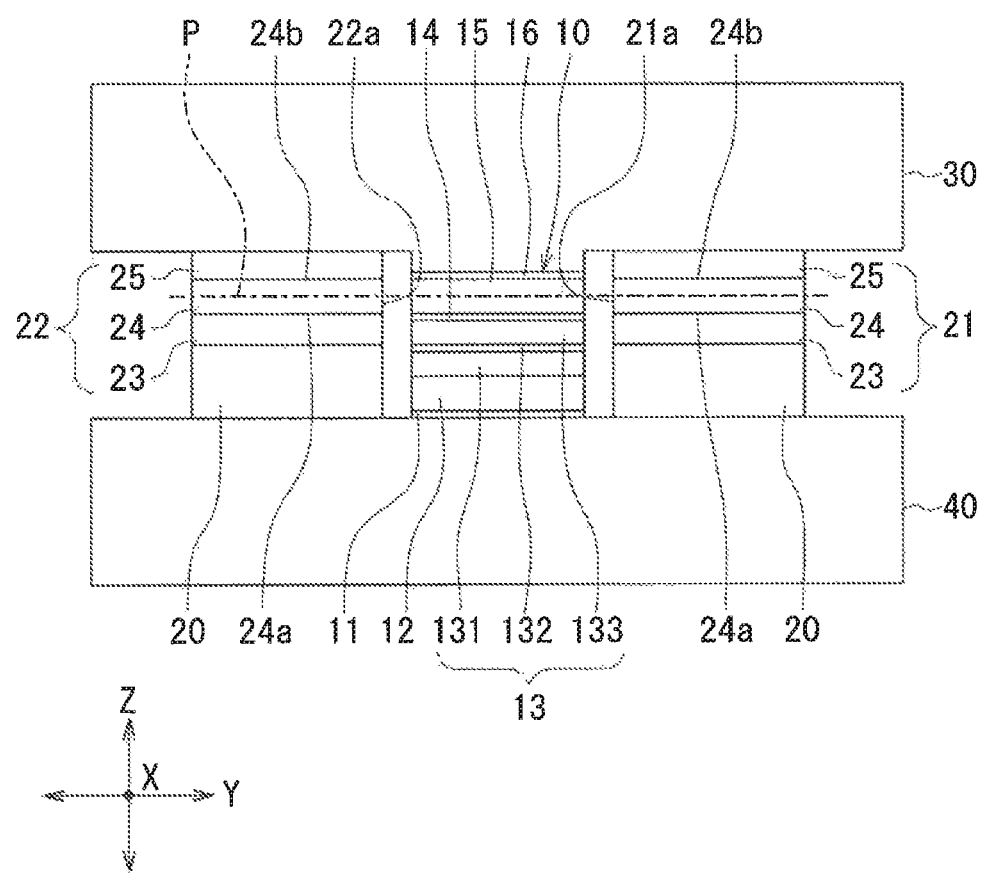
FIG. 5 is an enlarged cross-sectional view of the portion of the magnetic sensor shown in FIG. 2.

The first and second bias magnetic field generation units will now be described in detail with reference to FIG. 4 and FIG. 5. FIG. 4 is an enlarged perspective view of a portion of the magnetic sensor 1 shown in FIG. 2. FIG. 5 is an enlarged cross-sectional view of the portion of the magnetic sensor 1 shown in FIG. 2. In the following description, reference numeral 10 will be used to represent any of the MR elements. Reference numerals 21 and 22 will be used to represent any of the first bias magnetic field generation units and any of the second bias magnetic field generation units, respectively. Reference numerals 30 and 40 will be used to represent whichever one of the upper electrodes and whichever one of the lower electrodes, respectively. FIG. 4 and FIG. 5 illustrate an MR element 10, first and second bias magnetic field generation units 21 and 22 for generating a bias magnetic field to be applied to the MR element 10, and an upper electrode 30 and a lower electrode 40 for supplying current to the MR element 10.

As shown in FIG. 5, each of the first and second bias magnetic field generation units 21 and 22 includes a ferromagnetic layer 24 and a first antiferromagnetic layer 23 stacked along a second direction orthogonal to the first direction (Y direction). In the first embodiment, the second direction is the Z direction. The ferromagnetic layer 24 has a first surface 24a and a second surface 24b located at opposite ends in the second direction (Z direction). The first antiferromagnetic layer 23 is in contact with the first surface 24a of the ferromagnetic layer 24 and exchange-coupled to the ferromagnetic layer 24. In the example shown in FIG. 5, each of the first and second bias magnetic field generation units 21 and 22 further includes a second antiferromagnetic layer 25 in contact with the second surface 24b of the ferromagnetic layer 24 and exchange-coupled to the ferromagnetic layer 24. In this example, the first antiferromagnetic layer 23, the ferromagnetic layer 24 and the second antiferromagnetic layer 25 are stacked in this order along the second direction (Z direction).

In the first embodiment, the magnetic sensor 1 includes an insulating layer 20 interposed between the lower electrode 40 and the first and second bias magnetic field generation units 21 and 22. FIG. 2 and FIG. 4 omit the illustration of the insulating layer 20, and schematically illustrate the arrangement of the first and second bias magnetic field generation units 21 and 22. The insulating layer 20 lies on the top surface of the lower electrode 40. The first antiferromagnetic layer 23 lies on the top surface of the insulating layer 20. The top surface of the second antiferromagnetic layer 25 is in contact with the bottom surface of the upper electrode 30. The insulating layer 20 has the function of preventing the upper electrode 30 and the lower electrode 40 from being electrically connected to each other through the first and second bias magnetic field generation units 21 or 22, and the function of adjusting the positions of the first and second bias magnetic field generation units 21 and 22 in the Z direction. The magnetic sensor 1 may include, instead of the insulating layer 20, another insulating layer interposed between the upper electrode 30 and the first and second bias magnetic field generation units 21 and 22. Alternatively, the magnetic sensor 1 may include both of the insulating layer 20 and the aforementioned other insulating layer.

The ferromagnetic layer 24 has a magnetization in a direction parallel to the first direction (Y direction). The direction of the magnetization of the ferromagnetic layer 24 is determined by exchange coupling between the ferromagnetic layer 24 and each of the first and second antiferromagnetic layers 23 and 25. In the first embodiment, the ferromagnetic layer 24 of the first bias magnetic field generation unit 21 and the ferromagnetic layer 24 of the second bias magnetic field generation unit 22 are magnetized in the same direction. The first and second bias magnetic field generation units 21 and 22 cooperate with each other to generate, on the basis of the magnetizations of the ferromagnetic layers 24, magnetic fields including a bias magnetic field Hb to be applied to the MR element 10. The bias magnetic field Hb at the location where the MR element 10 is placed contains, as a principal component, a component parallel to the first direction (Y direction) and oriented in the same direction as the magnetizations of the ferromagnetic layers 24.

In each of the first and second bias magnetic field generation units 21 and 22, the ferromagnetic layer 24 is formed of a ferromagnetic material containing one or more elements selected from the group consisting of Co, Fe and Ni. Examples of such a ferromagnetic material include CoFe, CoFeB, and CoNiFe. The ferromagnetic layer 24 may be formed of a stack of two or more layers in which every adjacent two layers are formed of different ferromagnetic materials. Examples of such a stack forming the ferromagnetic layer 24 include a stack of a Co layer, a CoFe layer and a Co layer, and a stack of a $Co_{70}Fe_{30}$ layer, a $Co_{30}Fe_{70}$ layer and a $Co_{70}Fe_{30}$ layer. Note that $Co_{70}Fe_{30}$ represents an alloy containing 70 atomic percent Co and 30 atomic percent Fe, and $Co_{30}Fe_{70}$ represents an alloy containing 30 atomic percent Co and 70 atomic percent Fe. The first and second antiferromagnetic layers 23 and 25 are each formed of an antiferromagnetic material such as IrMn or PtMn. The ferromagnetic layer 24 preferably has a thickness of 8 nm or more. Assuming that the ferromagnetic layer 24 is formed of CoFe and has a thickness of 8 nm, the first and second bias magnetic field generation units 21 and 22 can generate a bias magnetic field Hb having a strength of the order of 10 Oe. Note that 1 Oe=79.6 A/m.

The second antiferromagnetic layer 25 is not an essential component of each of the first and second bias magnetic field generation units 21 and 22, and can be dispensed with.

As shown in FIG. 4, each of the first and second bias magnetic field generation units 21 and 22 has a first end and a second end opposite to each other in the X direction. The X direction is orthogonal to both of the first direction (Y direction) and the second direction (Z direction), and corresponds to the third direction in the present invention. Hereinafter, the first end and the second end of the first bias magnetic field generation unit 21 will be denoted by symbols E11 and E12, respectively. The first end and the second end of the second bias magnetic field generation unit 22 will be denoted by symbols E21 and E22, respectively. When viewed from the MR element 10, the first ends E11 and E21 are located on the same side in the third direction (X direction).

In the example shown in FIG. 4, the first bias magnetic field generation unit 21 has a first end face 21a facing toward the second bias magnetic field generation unit 22. The second bias magnetic field generation unit 22 has a second end face 22a opposed to the first end face 21a.

In the example shown in FIG. 4, both of the first and second bias magnetic field generation units 21 and 22 are in the shape of a rectangular prism, and are rectangular when viewed in the second direction (Z direction). Alternatively, when viewed in the second direction (Z direction), the first and second bias magnetic field generation units 21 anal 22 may each be in the shape of a polygon other than a rectangle, or may each be shaped such that at least a part of the outer edge thereof is curved. In the example shown in FIG. 4, all of the first, ends E11 and E21 and the second ends E12 and E22 are in the form of a plane. Alternatively, at least one of the first and second ends E11, E21, E12 and E22 may be in the form of a line or a point.

An example of the configuration of the MR element 10 will now be described with reference to FIG. 5. In the first embodiment, a spin-valve MR element is used as the MR element 10. The MR element 10 includes at least a magnetization pinned layer 13 having a magnetization pinned in a certain direction, a free layer 15 having a magnetization that varies depending on the target magnetic field, and a nonmagnetic layer 14 located between the magnetization pinned layer 13 and the free layer 15.

In the example shown in FIG. 5, the MR element 10 further includes an underlayer 11, an antiferromagnetic layer 12 and a protective layer 16. In this example, the underlayer 11, the antiferromagnetic layer 12, the magnetization pinned layer 13, the nonmagnetic layer 14, the free layer 15 and the protective layer 16 are stacked along the second direction (Z direction) in the listed order as viewed from the lower electrode 40. The underlayer 11 and the protective layer 16 are conductive. The underlayer 11 is provided to eliminate the effects of the crystal axis of the non-illustrated substrate and to improve the crystallinity and orientability of the layers to be formed over the underlayer 11. The underlayer 11 may be formed of Ta or Ru, for example. The antiferromagnetic layer 12 is to pin the direction of the magnetization of the magnetization pinned layer 13 by means of exchange coupling with the magnetization pinned layer 13. The antiferromagnetic layer 12 is formed of an antiferromagnetic material such as IrMn or PtMn.

The magnetization of the magnetization pinned layer 13 is pinned in a certain direction by the exchange coupling between the antiferromagnetic layer 12 and the magnetization pinned layer 13. In the example shown in FIG. 5, the magnetization pinned layer 13 includes an outer layer 131, a nonmagnetic intermediate layer 132 and an inner layer 133 stacked in this order on the antiferromagnetic layer 12, and is thus formed as a so-called synthetic pinned layer. The outer layer 131 and the inner layer 133 are each formed of a ferromagnetic material such as CoFe, CoFeB or CoNiFe.

The outer layer 131 is exchange-coupled to the antiferromagnetic layer 12 and thus the magnetization direction thereof is pinned. The outer layer 131 and the inner layer 133 are antiferromagnetically coupled to each other, and their magnetizations are thus pinned in mutually opposite directions. The nonmagnetic intermediate layer 132 induces antiferromagnetic exchange coupling between the outer layer 131 and the inner layer 133 so as to pin the magnetizations of the outer layer 131 and the inner layer 133 in mutually opposite directions. The nonmagnetic intermediate layer 132 is formed of a nonmagnetic material such as Ru. When the magnetization pinned layer 13 includes the outer layer 131, the nonmagnetic intermediate layer 132 and the inner layer 133, the direction of the magnetization of the magnetization pinned layer 13 refers to that of the inner layer 133.

If the MR element 10 is a TMR element, the nonmagnetic layer 14 is a tunnel barrier layer. The tunnel barrier layer may be formed by oxidizing a part or the whole of a magnesium layer. If the MR element 10 is a GMR element, the nonmagnetic layer 14 is a nonmagnetic conductive layer. The free layer 15 is formed of, for example, a soft magnetic material such as CoFe, CoFeB, NiFe, or CoNiFe. The protective layer 16 is provided for protecting the layers located thereunder. The protective layer 16 may be formed of Ta, Ru, W, or Ti, for example.

The underlayer 11 is connected to the lower electrode 40, and the protective layer 16 is connected to the upper electrode 30. The MR element 10 is configured to be supplied with current by the lower electrode 40 and the upper electrode 30. The current flows in a direction intersecting the layers constituting the MR element 10, such as the second direction (Z direction) which is perpendicular to the layers constituting the MR element 10.

In the MR element 10, the magnetization of the free layer 15 varies depending on the magnetic field applied to the free layer 15. More specifically, the direction and magnitude of the magnetization of the free layer 15 vary depending on the direction and magnitude of the magnetic field applied to the free layer 15. The MR element 10 varies in resistance depending on the direction and magnitude of the magnetization of the free layer 15. For example, if the free layer 15 has a magnetization of a constant magnitude, the MR element 10 has a minimum resistance when the magnetization of the free layer 15 is in the same direction as that of the magnetization pinned layer 13, and has a maximum resistance when the magnetization of the free layer 15 is in the opposite direction to that of the magnetization pinned layer 13.

Reference is now made to FIG. 2 to describe the directions of the magnetizations of the magnetization pinned layers 13 of the MR elements 10A to 10D. In FIG. 2, the arrows labeled 10AP, 10BP, 10CP and 10DP indicate the directions of the magnetizations of the magnetization pinned layers 13 of the MR elements 10A, 10B, 10C and 10D, respectively. As shown in FIG. 2, the direction 10AP of the magnetization of the magnetization pinned layer 13 of the MR element 10A is parallel to the X direction. The direction 10AP is leftward in FIG. 2. The direction 10BP of the magnetization of the magnetization pinned layer 13 of the MR element 10B is opposite to the direction 10AP. The direction 10BP is rightward in FIG. 2. In this case, the potential at the connection point between the MR elements 10A and 10B varies depending on the strength of a component of the target magnetic field in a direction parallel to the directions 10AP and 10BP, i.e., in the X direction. The first output port E1 outputs the first detection signal corresponding to the potential at the connection point between the MR elements 10A and 10B. The first detection signal represents the strength of the component of the target magnetic field in the X direction.

As shown in FIG. 2, the direction 10CP of the magnetization of the magnetization pinned layer 13 of the MR element 10C is the same as the direction 10AP, while the direction 10DP of the magnetization of the magnetization pinned layer 13 of the MR element 10D is the same as the direction 10BP. In this case, the potential at the connection point between the MR elements 10C and 10D varies depending on the strength of the component of the target magnetic field in the direction parallel to the directions 10CP and 10DP (the same as the direction parallel to the directions 10AP and 10BP), i.e., in the X direction. The second output port E2 outputs the second detection signal corresponding to the potential at the connection point between the MR elements 10C and 10D. The second detection signal represents the strength of the component of the target magnetic field in the X direction.

As for the MR element 10A and the MR element 10D, their respective magnetization pinned layers 13 have magnetizations in mutually opposite directions. As for the MR element 10B and the MR element 10C, their respective magnetization pinned layers 13 have magnetizations in mutually opposite directions. Thus, the second detection signal has a phase difference of 180° with respect to the first detection signal.

In consideration of the production accuracy of the MR elements 10A to 10D and other factors, the directions of the magnetizations of the magnetization pinned layers 13 of the MR elements 10A to 10D may be slightly different from the above-described directions.

Now, the bias magnetic field. Hb generated by each of the four pairs of first and second bias magnetic field generation units (21A, 22A), (21B, 22B), (21C, 22C) and (21D, 22D) will be described with reference to FIG. 2. In FIG. 2, the arrow labeled Hb indicates the direction of the bias magnetic field Hb at the location of the MR element 10 situated nearest the arrow. As shown in FIG. 2, at each of the locations where the MR elements 10A to 10D are placed, the bias magnetic field Hb contains a component in a direction parallel to the Y direction (the first direction). The direction is toward the upper right in FIG. 2. The bias magnetic field Hb is used to make the free layer 15 have a single magnetic domain and to orient the magnetization of the free layer 15 in a certain direction, when the strength of the component of the target magnetic field in the X direction, i.e., in the direction parallel to the magnetization direction of the pinned layer 13, is zero.

In the magnetic sensor system shown in FIG. 1, the magnetic sensor 1 is placed to face the outer circumferential surface of the rotation scale 50 in such a position that the Z direction is parallel or almost parallel to a straight line connecting the location of the magnetic sensor 1 and the central axis C while the X direction is parallel or almost parallel to an imaginary plane perpendicular to the central axis C. In this case, the direction of the principal component of the bias magnetic field Hb at the location of the MR element 10, which is a direction parallel to the Y direction, is parallel or almost parallel to the central axis C shown in FIG. 1.

Figure 6:
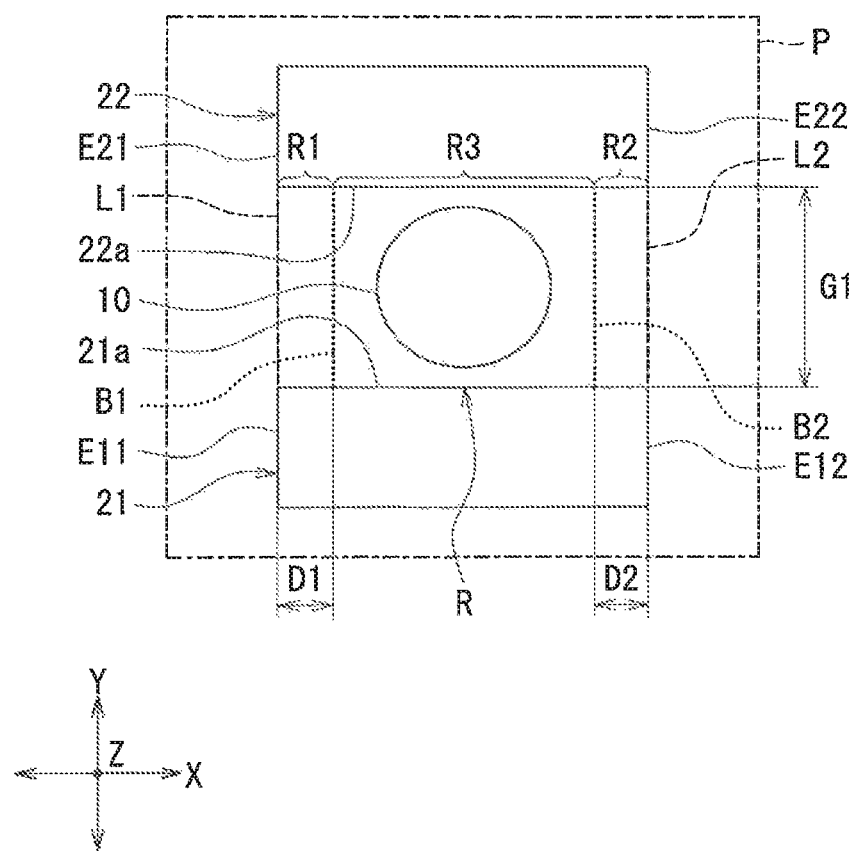
FIG. 6 is an explanatory diagram illustrating the positional relationship between the MR element and the first and second bias magnetic field generation units shown in FIG. 4 and FIG. 5.

Reference is now made to FIG. 2 and FIGS. 4 to 6 to describe the positional relationship between the magnetic detection element (MR element 10) and the first and second bias magnetic field generation units 21 and 22. FIG. 6 is an explanatory diagram illustrating the positional relationship between the MR element 10 and the first and second bias magnetic field generation units 21 and 22 shown in FIG. 4 and FIG. 5. In FIG. 5 and FIG. 6, the symbol P represents an imaginary plane perpendicular to the second direction (Z direction) and intersecting at least one magnetic detection element. The imaginary plane P may intersect both or neither of the first and second bias magnetic field generation units 21 and 22. In the latter case, the first and second bias magnetic field generation units 21 and 22 may be located at the same position or different positions in the second direction (Z direction). Alternatively, the imaginary plane P may intersect one of the first and second bias magnetic field generation units 21 and 22, not intersecting the other.

By way of example, FIGS. 2, 4 and 5 illustrate the case where the imaginary plane P intersects both of the first and second bias magnetic field generation units 21 and 22. In this case, as shown in FIG. 5, the imaginary plane P may intersect the ferromagnetic layer 24 of each of the first and second bias magnetic field generation units 21 and 22 and the free layer 15 of the MR element 10.

Now, a first imaginary straight line L1 and a second imaginary straight line L2 are defined in the imaginary plane P as shown in FIG. 6. The first imaginary straight line L1 is a straight line passing through the first ends E11 and E21 of the first and second bias magnetic field generation units 21 and 22 when viewed in the second direction (Z direction). The second imaginary straight line L2 is a straight line passing through the second ends E12 and E22 of the first and second bias magnetic field generation units 21 and 22 when viewed in the second direction (Z direction). In FIG. 6, the first and second imaginary straight lines L1 and L2 are shown by broken lines. The first and second bias magnetic field generation units 21 and 22 are preferably shaped and positioned to make the first and second imaginary straight lines L1 and L2 parallel to the first direction (Y direction).

If at least part of the first end E11 is located in the imaginary plane P, the first imaginary straight line L1 passes through the position of the first end E11 in the imaginary plane P. If the first end E11 is located off the imaginary plane P, the first imaginary straight line L1 passes through the position of a vertical projection of the first end E11 on the imaginary plane P.

If at least part of the first end. E21 is located in the imaginary plane P, the first imaginary straight line L1 passes through the position of the first end E21 in the imaginary plane P. If the first end E21 is located off the imaginary plane P, the first imaginary straight line L1 passes through the position of a vertical projection of the first end E21 on the imaginary plane P.

If at least part of the second end E12 is located in the imaginary plane P, the second imaginary straight line L2 passes through the position of the second end E12 in the imaginary plane P. If the second end E12 is located off the imaginary plane P, the first imaginary straight line L1 passes through the position of a vertical projection of the second end E12 on the imaginary plane P.

If at least part of the second end E22 is located in the imaginary plane P, the second imaginary straight line L2 passes through the position of the second end E22 in the imaginary plane P. If the second end E22 is located off the imaginary plane P, the second imaginary straight line L2 passes through the position of a vertical projection of the second end E22 on the imaginary plane P.

In the example shown in FIG. 5 and FIG. 6, the imaginary plane P intersects the first ends E11 and E21 and the second ends E12 and E22, all of which are in the form of a plane. In this case, the first imaginary straight line L1 passes through the positions of the first ends E11 and E21 in the imaginary plane P, and the second imaginary straight line L2 passes through the positions of the second ends E12 and E22 in the imaginary plane P.

The first and second bias magnetic field generation units 21 and 22 are positioned to define an element placement region R in the imaginary plane P. The element placement region R is located between the first bias magnetic field generation unit 21 and the second bias magnetic field generation unit 22 when viewed in the second direction (Z direction), and between the first imaginary straight line L1 and the second imaginary straight line L2.

The element placement region R is a region enclosed by a part of the perimeter of the first bias magnetic field generation unit 21 as viewed in the second direction (Z direction), a part of the perimeter of the second bias magnetic field generation unit 22 as viewed in the second direction (Z direction), the first imaginary straight line L1, and the second imaginary straight line L2.

In the example shown in FIG. 5 and FIG. 6, the first end face 21a of the first bias magnetic field generation unit 21 and the second end face 22a of the second bias magnetic field generation unit 22 are parallel to the second direction (Z direction). The imaginary plane P intersects the first end face 21a and the second end face 22a. In this case, the element placement region R is a region enclosed by the first end face 21a, the second end face 22a, the first imaginary straight line L1, and the second imaginary straight line L2.

As shown in FIG. 6, the element placement region R includes a first end region R1, a second end region R2 and a middle region R3 each of which has an area. The first end region R1 is located closer to the first imaginary straight line L1 than is the middle region R3. The second end region R2 is located closer to the second imaginary straight line L2 than is the middle region R3. The middle region R3 is located between the first end region R1 and the second end region R2, borders on the first end region R1 along a first border line B1 parallel to the first imaginary straight line L1, and borders on the second end region R2 along a second border line B2 parallel to the second imaginary straight line L2. In FIG. 6, the first and second border lines B1 and B2 are shown by dotted lines.

The at least one magnetic detection element is placed such that the entirety of the at least one magnetic detection element lies within the middle region R3 in the imaginary plane P. In the first embodiment, in particular, one MR element 10 as the at least one magnetic detection element is placed such that the entirety of the MR element 10 lies within the middle region R3 in the imaginary plane P.

As shown in FIG. 6, the distance between the first imaginary straight line L1 and the first border line B1 will be denoted by the symbol D1, the distance between the second imaginary straight line L2 and the second border line B2 will be denoted by the symbol D2, and the distance between the first bias magnetic field generation unit 21 and the second bias magnetic field generation unit 22 will be denoted by the symbol G1. The distances D1 and D2 are both preferably 30% of the distance G1. The reasons therefor will be described in detail later.

FIG. 2 and FIGS. 4 to 6 illustrate an example in which only one MR element 10 is situated within the middle region R3. Alternatively, as will be described later in relation to a second embodiment, a plurality of MR elements 10 may be situated within the middle region R3.

The function and effects of the magnetic sensor 1 and the magnetic sensor system according to the first embodiment will now be described. In the first embodiment, each of the first and second bias magnetic field generation units 21 and 22 includes the ferromagnetic layer 24 and the first antiferromagnetic layer 23. The first antiferromagnetic layer 23 is exchange-coupled to the ferromagnetic layer 24. The direction of the magnetization of the ferromagnetic layer 24 is thereby determined. The first and second bias magnetic field generation units 21 and 22 cooperate with each other to generate the bias magnetic field Hb to be applied to the MR element 10, on the basis of the magnetizations of the ferromagnetic layers 24 of the first and second bias magnetic field generation units 21 and 22.

Figure 7:
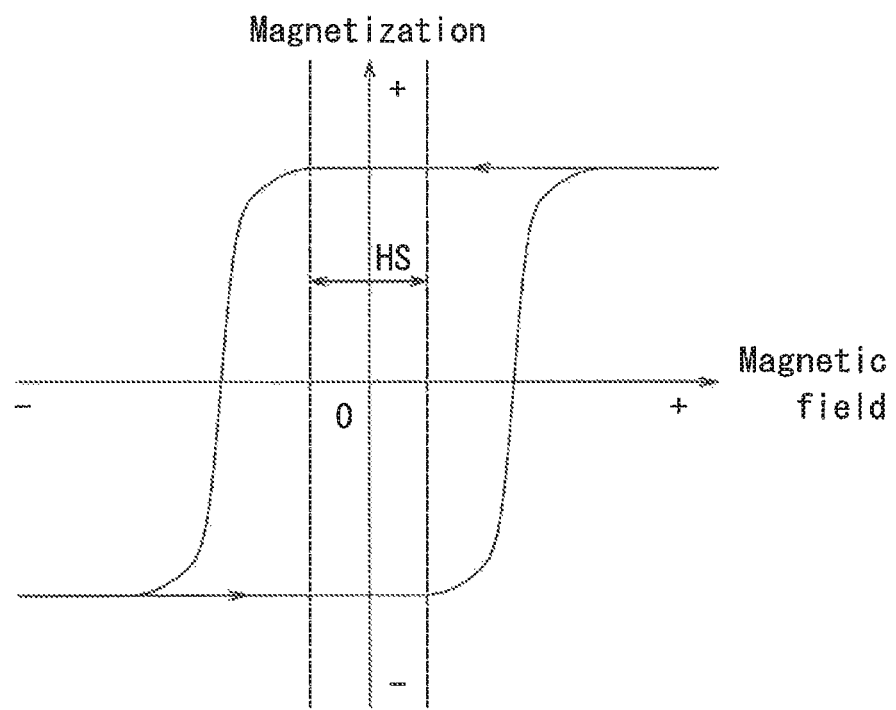
FIG. 7 is a characteristic diagram illustrating the magnetization curve of a permanent magnet.
Figure 8:
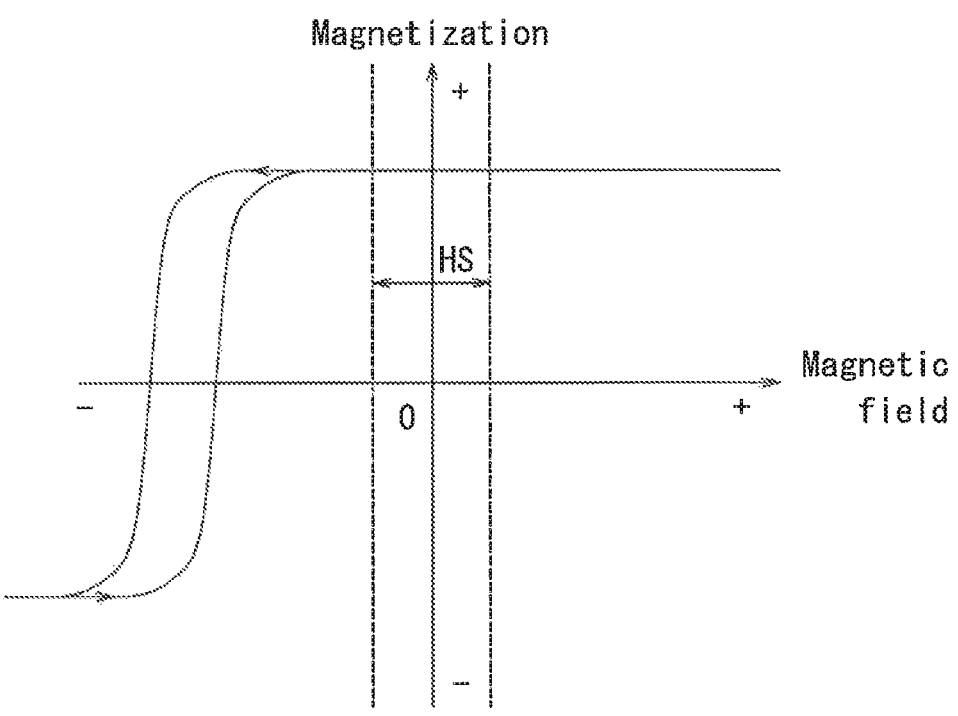
FIG. 8 is a characteristic diagram illustrating the magnetization curve of each of the first and second bias magnetic field generation units shown in FIG. 4 to FIG. 6.

The effects of the magnetic sensor 1 according to the first embodiment will now be described in comparison with a magnetic sensor of a comparative example. The magnetic sensor of the comparative example uses a pair of permanent magnets as the means for generating a bias magnetic field, in place of the first and second bias magnetic field generation units 21 and 22. First, with reference to FIG. 7 and FIG. 8, comparisons will be made between a magnetization curve of a permanent magnet and that of each of the first and second bias magnetic field generation units 21 and 22 FIG. 7 is a characteristic diagram illustrating the magnetization curve of a permanent magnet. FIG. 8 is a characteristic diagram illustrating the magnetization curve of each of the first and second bias magnetic field generation units 21 and 22. Assume here that the magnetization curve of the first bias magnetic field generation unit 21 and the magnetization curve of the second bias magnetic field generation unit 22 coincide with each other. In each of FIG. 7 and FIG. 8, the horizontal axis represents magnetic field, and the vertical axis represents magnetization. For both of the magnetic field and the magnetization, positive values represent magnitude in a predetermined direction, while negative values represent magnitude in the opposite direction from the predetermined direction. Arrows in the magnetization curves indicate the direction of a change in the magnetic field. The range of the magnetic field indicated with the symbol HS represents the range of the target magnetic field.

The magnetic sensor of the comparative example is used under the condition that the strength of the target magnetic field does not exceed the coercivity of the permanent magnets. However, an external magnetic field having a strength exceeding the coercivity of the permanent magnets can happen to be temporarily applied to the permanent magnets, because the magnetic sensor can be used in various environments. When such an external magnetic field is temporarily applied to the permanent magnets, the direction of the magnetization of the permanent magnets may be changed from an original direction and then remain different from the original direction even after the external magnetic field disappears. For example, as shown in FIG. 7, if an external magnetic field of a positive value beyond the range HS of the target magnetic field is temporarily applied to the permanent magnets, the direction of the magnetization of the permanent magnets is pinned in a positive direction after the external magnetic field disappears. On the other hand, if an external magnetic field of a negative value falling outside the range HS of the target magnetic field is temporarily applied to the permanent magnets, the direction of the magnetization of the permanent magnets is pinned in a negative direction after the external magnetic field disappears. Thus, in the magnetic sensor of the comparative example, a temporary application of an external magnetic field of a strength exceeding the coercivity of the permanent magnets to the permanent magnets may change the direction of the bias magnetic field from a desired direction.

In contrast, in each of the first and second bias magnetic field generation units 21 and 22 of the first embodiment, as understood from FIG. 8, even if an external magnetic field having a high strength sufficient to reverse the direction of the magnetization of the ferromagnetic layer 24 is temporarily applied, the direction of the magnetization of the ferromagnetic layer 24 returns to an original direction upon disappearance of such an external magnetic field. The first embodiment thus allows application of a stable bias magnetic field Hb to the MR element 10. This advantageous effect is enhanced by providing each of the bias magnetic field generation units 21 and 22 with the second antiferromagnetic layer 25.

In the first embodiment, as shown in FIG. 6, at least one MR element 10 is placed such that the entirety of the at least one MR element 10 lies within the middle region R3 in the imaginary plane P. According to the first embodiment, this makes it possible to apply a bias magnetic field Hb of high uniformity to the MR element 10 and also reduce a variation in the bias magnetic field Hb in response to a variation in the relative positional relationship between the MR element 10 and the first and second bias magnetic field generation units 21 and 22. Such advantageous effects will now be described in detail.

First, a reference component will be defined as follows. The reference component is a component of the bias magnetic field Hb in the same direction as the magnetization of the ferromagnetic layer 24 in the imaginary plane P. The reference component is a principal component of the bias magnetic field Hb to be applied to the MR element 10.

Next, simulation results will be described. The simulation investigated the distribution of strength of the reference component of the bias magnetic field Hb in the imaginary plane P for a first to a third model of the magnetic sensor 1. In the first model, the first and second bias magnetic field generation units 21 and 22 shown in FIG. 6 are 8.8 μm in length in the X direction, and are spaced a distance G1 of 2 μm apart from each other, in the second model, the first and second bias magnetic field generation units 21 and 22 are 8.8 μm in length in the X direction, and are spaced a distance G1 of 3 μm apart from each other. In the third model, the first and second bias magnetic field generation units 21 and 22 are 18.8 μm in length in the X direction, and are spaced a distance G1 of 2 μm apart from each other. In each of the first to third models, the imaginary plane P intersects the first and second bias magnetic field generation units 21 and 22.

Figure 9:
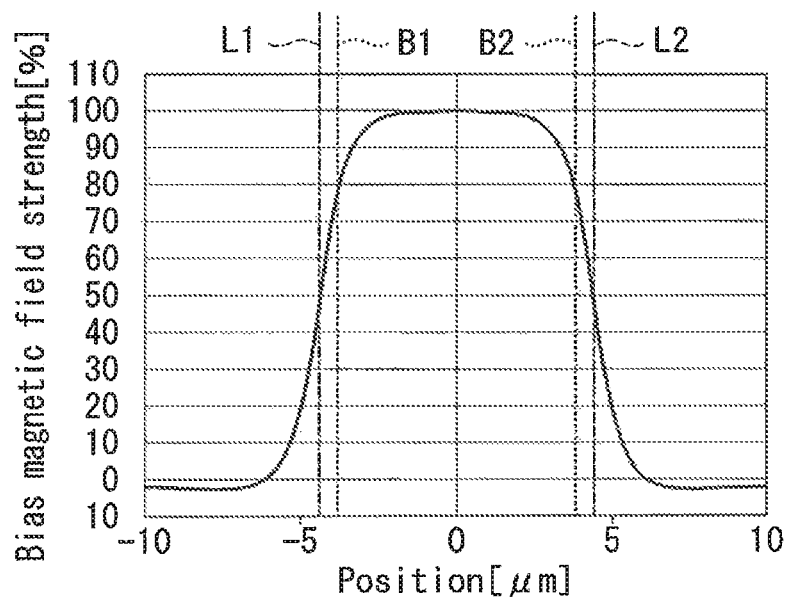
FIG. 9 is a characteristic diagram illustrating the distribution of strength of a reference component of a bias magnetic field in a reference plane for a first magnetic sensor model.
Figure 10:
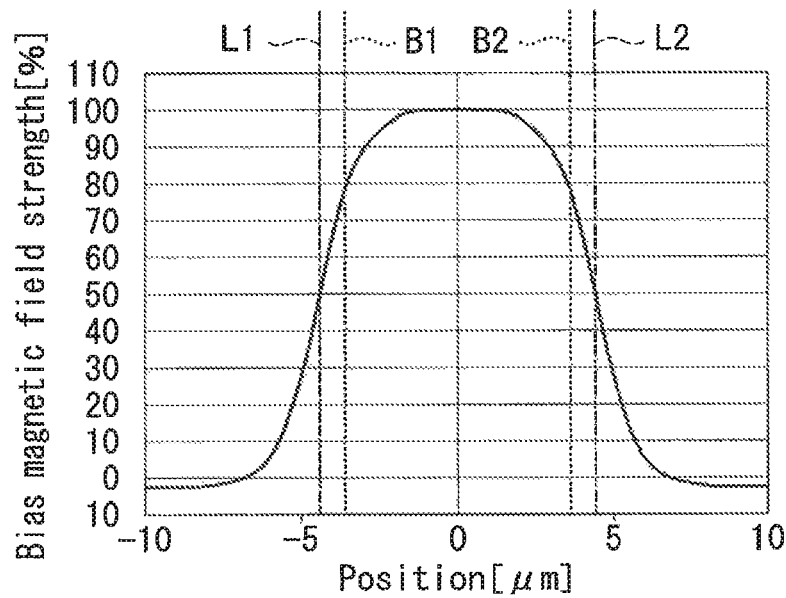
FIG. 10 is a characteristic diagram illustrating the distribution of strength of the reference component of the bias magnetic field in the reference plane for a second magnetic sensor model.
Figure 11:
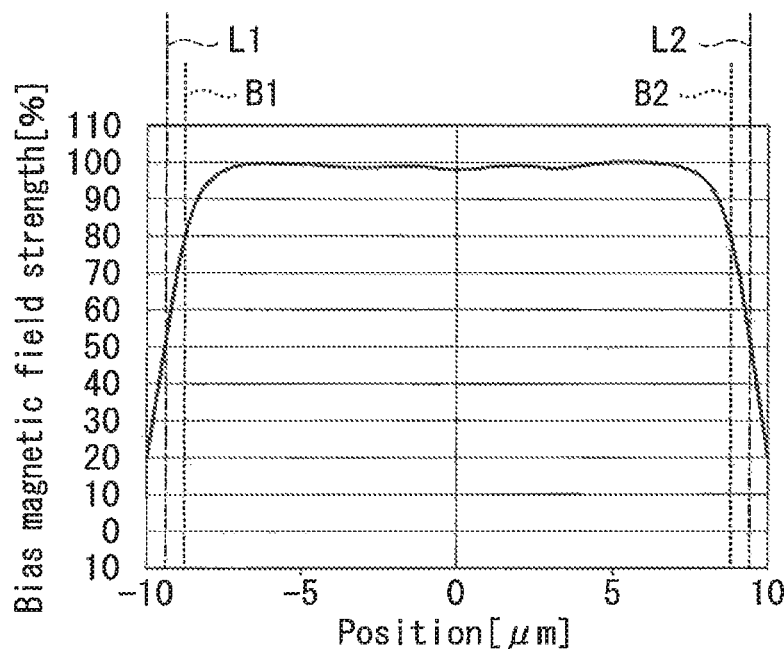
FIG. 11 is a characteristic diagram illustrating the distribution of strength of the reference component of the bias magnetic field in the reference plane for a third magnetic sensor model.

FIGS. 9 to 11 are characteristic diagrams illustrating the distributions of strengths of the reference component of the bias magnetic field Hb in the imaginary plane P for the first to third models of the magnetic sensor 1, respectively. In each of FIGS. 9 to 11, the horizontal axis represents position on a straight line parallel to the X direction and passing through a center point of the middle region R3 in the imaginary plane P shown in FIG. 6. The center point of the middle region R3 is the point located equidistant from the first end face 21a and the second end face 22a and also equidistant from the first border line B1 and the second border line B2. On the horizontal axis of each of FIGS. 9 to 11, the position of the center point of the middle region R3 is taken as 0 μm, and negative values represent positions that are on the side of the first imaginary straight line L1 with respect to the center point of the middle region R3, while positive values represent positions that are on the side of the second imaginary straight line L2 with respect to the center point of the middle region R3. The vertical axis in each of FIGS. 9 to 11 represents the strength of the reference component of the bias magnetic field Hb in the imaginary plane P. In FIGS. 9 to 11, the strength of the reference component of the bias magnetic field Hb in the imaginary plane P is normalized so that its maximum value is 100%.

In each of FIGS. 9 to 11, the two broken lines L1 and L2 represent the positions of the first and second imaginary straight lines L1 and L2 shown in FIG. 6, respectively. The dotted line B1 represents the position of the first border line B1 determined with the distance D1 between the first imaginary straight line L1 and the first border line B1 in FIG. 6 set at 30% of the distance G1. The dotted line B2 represents the position of the second border line B2 determined with the distance D2 between the second imaginary straight line L2 and the second border line B2 in FIG. 6 set at 30% of the distance G1.

In each of FIGS. 9 to 11, the distribution of strength of the reference component between the lines B1 and B2 represents the distribution of strength thereof in the middle region R3 determined with both of the distances D1 and D2 set at 30% of the distance G1. The distribution of strength of the reference component between the lines L1 and B1 represents the distribution of strength thereof in the first end region R1. The distribution of strength of the reference component between the lines L2 and B2 represents the distribution of strength thereof in the second end region R2.

As shown in FIGS. 9 to 11, in the first end region R1 and the second end region R2 the strength of the reference component sharply decreases with increasing distance from the center point of the middle region R3. Thus, the gradient of change in the strength of the reference component versus the change in the position along the third direction (X direction) is clearly larger in the first and second end regions R1 and R2 than in the middle region R3. Accordingly, by placing the MR element 10 such that the entirety thereof lies within the middle region R3, it is possible to apply a bias magnetic field Hb of higher uniformity to the MR element 10 and to reduce a variation in the bias magnetic field Hb in response to a variation in the relative positional relationship between the MR element 10 and the first and second bias magnetic field generation units 21 and 22, as compared with the case where the MR element 10 is placed such that at least a part thereof lies within the first end region R1 or the second end region R2 when viewed in the second direction (Z direction).

FIGS. 9 to 11 indicate that when the distances D1 and D2 are both set at 30% of the distance 1, the strength of the reference component in the middle region R3 falls within the range of 80% to 100% of the maximum strength of the reference component in the imaginary plane P. From the viewpoint of reducing a variation in the strength of the reference component in the middle region R3 in which the MR element 10 is placed, it is preferred that both of the distances D1 and D2 be 30% of the distance G1.

In order to allow the entirety of the MR element 10 to lie within the middle region R3 in the imaginary plane P when both of the distances D1 and D2 are 30% of the distance G1, the distance between the first imaginary straight line L1 and the second imaginary straight line L2 shown in FIG. 6 needs to be at least 60% of the distance G1 plus the width of the MR element 10 in the X direction. By minimizing the distance between the first imaginary straight line L1 and the second imaginary straight line L2 while satisfying the above requirement, it becomes possible to apply a bias magnetic field Hb of high uniformity to the MR element 10 while minimizing the entire magnetic sensor 1 in size.

If the imaginary plane P intersects neither of the first and second bias magnetic field generation units 21 and 22, the strength of the reference component in the middle region R3 decreases with increasing distance from the imaginary plane P to each of the first and second bias magnetic field generation units 21 and 22. Now, the strength of the reference component at the center point of the middle region R3 assuming that the imaginary plane P intersects the first and second bias magnetic field generation units 21 and 22 will be referred to as the reference strength. In order to reduce a decrease in the strength of the reference component in the middle region R3 when the imaginary plane P intersects neither of the first and second bias magnetic field generation units 21 and 22, the first and second bias magnetic field generation units 21 and 22 preferably have such a positional relationship with the imaginary plane P that the strength of the reference component at the center point of the middle region R3 is 80% or more of the reference strength.

Some read head units in magnetic heads for use in magnetic disk drives are structured to include an MR element and a pair of bias magnetic field generation units arranged so that the bias magnetic field generation units are opposed to each other with the MR element therebetween. In such read head units, one end of the MR, element and one end of each of the pair of bias magnetic field generation units are aligned in the medium facing surface, which is a surface of the magnetic head to face the recording medium. In contrast, according to the first embodiment, the arrangement of the MR element 10 and the first and second bias magnetic field generation units 21 and 22 is such that one end of the MR element 10 is not aligned with one end of each of the first and second bias magnetic field generation units 21 and 22. Thus, the read head units in magnetic heads do not satisfy the requirement pertaining to the arrangement of the MR element 10 and the first and second bias magnetic field generation units 21 and 22 of the first embodiment. For the read head units in magnetic heads, placing the MR element in such a position as to satisfy the requirement pertaining to the arrangement of the MR element 10 and the first and second bias magnetic field generation units 21 and 22 of the first embodiment is not conceivable because such a placement of the MR element would bring one end of the MR element away from the medium facing surface and thereby make the MR element lower in sensitivity.

Second Embodiment

Figure 12:
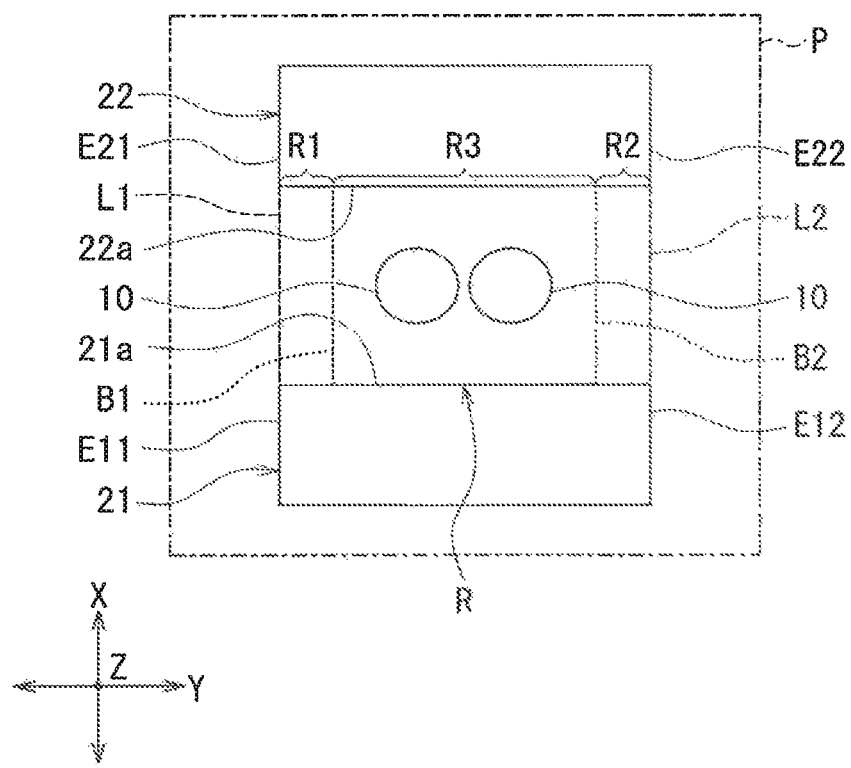
FIG. 12 is an explanatory diagram illustrating the positional relationship of MR elements with first and second bias magnetic field generation units in a second embodiment of the invention.

A second embodiment of the invention will now be described with reference to FIG. 12. FIG. 12 is an explanatory diagram illustrating the positional relationship of MR elements 10 with first and second bias magnetic field generation units 21 and 22 in a magnetic sensor according to the second embodiment. The magnetic sensor 1 according to the second embodiment includes eight MR elements 10, four first bias magnetic field generation units 21, four second bias magnetic field generation units 22, a substrate (not illustrated), two upper electrodes 30, and two lower electrodes 40. In the second embodiment, two MR elements 10 connected in parallel by the upper and lower electrodes 30 and 40 are placed at each of the locations of the MR elements 10A, 10B, 10C and 10D described in the first embodiment section.

In the second embodiment, every two MR elements 10 are placed such that the entirety of each of the two MR elements 10 lies within the middle region R3 of the element placement region R described in the first embodiment section. The magnetization pinned layers 13 of the two MR elements 10 are magnetized in the same direction. The second embodiment makes it possible to apply bias magnetic fields Hb of high uniformity to the two MR elements 10 and to reduce a difference in strength between the bias magnetic fields Hb to be applied to the two MR elements 10.

The remainder of configuration, function and effects of the second embodiment are similar to those of the first embodiment.

Third Embodiment

Figure 13:
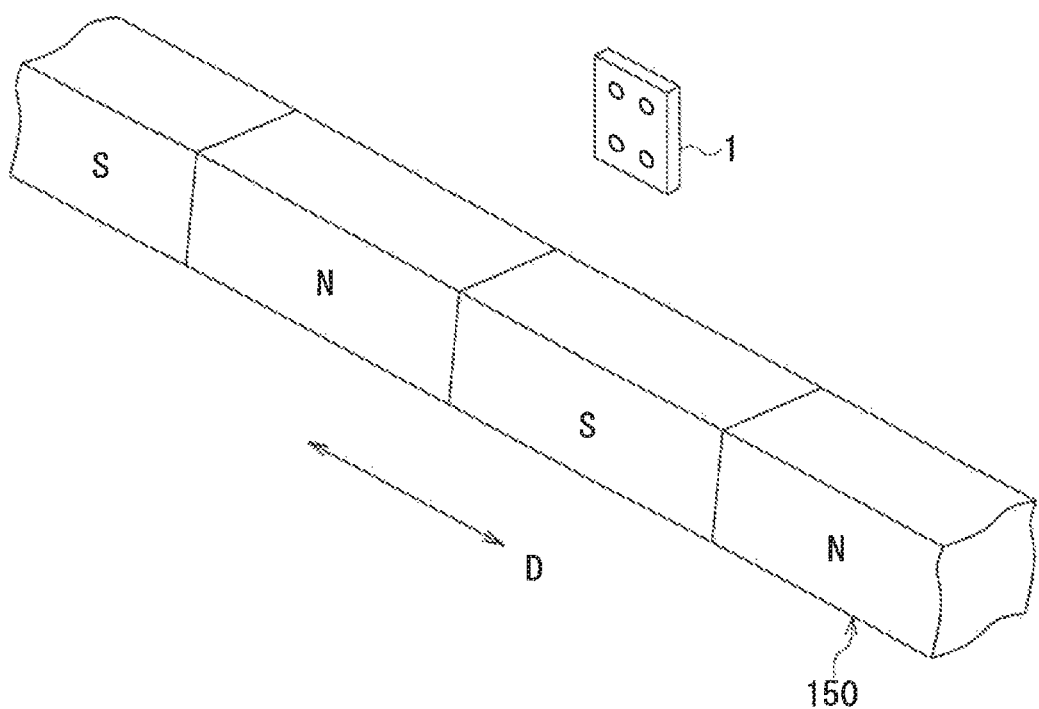
FIG. 13 is a perspective view illustrating the general configuration of a magnetic sensor system of a third embodiment of the invention.

A third embodiment of the invention will now be described with reference to FIG. 13. FIG. 13 is a perspective view illustrating the general configuration of a magnetic sensor system of the third embodiment. The magnetic sensor system of the third embodiment differs from that of the first embodiment in the following ways. The magnetic sensor system of the third embodiment has a linear scale 150 in place of the rotation scale 50. The linear scale 150 has a plurality of pairs of N and S poles arranged alternately in a linear configuration. The linear scale 150 has a side surface parallel to the direction in which the N and S poles are arranged. The magnetic sensor 1 is placed to face the side surface of the linear scale 150.

One of the linear scale 150 and the magnetic sensor 1 moves linearly in a predetermined direction D in response to the movement of a moving object (not illustrated). This causes a change in the relative position of the linear scale 150 with respect to the magnetic sensor 1 in the direction D. The direction D is the direction in which the N and S poles of the linear scale 150 are arranged. The magnetic sensor system detects, as the physical quantity associated with the relative positional relationship between the linear scale 150 and the magnetic sensor 1, the position and/or speed of the aforementioned moving body moving with one of the linear scale 150 and the magnetic sensor 1, for example.

In the third embodiment, the target magnetic field is generated by the linear scale 150, and the direction of the target magnetic field varies with changes in the relative position of the linear scale 150 with respect to the magnetic sensor 1.

The magnetic sensor 1 may be configured in the same manner as the first or second embodiment. The remainder of configuration, function and effects of the third embodiment are similar to those of the first or second embodiment.

The present invention is not limited to the foregoing embodiments, and various modifications may be made thereto. For example, as far as the requirements of the appended claims are met, the shapes and locations of the first and second bias magnetic field generation units 21 and 22, and the number, shape and location of the MR element 10 need not necessarily be as in the respective examples illustrated in the foregoing embodiments, and can be freely chosen.

Further, the MR element 10 may be formed by stacking the underlayer 11, the free layer 15, the nonmagnetic layer 14, the magnetization pinned layer 13, the antiferromagnetic layer 12, and the protective layer 16 in this order from the lower electrode 40 side.

It is apparent that the present invention can be carried out in various forms and modifications in the light of the foregoing descriptions. Accordingly, within the scope of the following claims and equivalents thereof, the present invention can be carried out in forms other than the foregoing most preferable embodiments.

What is claimed is:

1. A magnetic sensor comprising:
   at least one magnetic detection element for detecting a magnetic field to be detected; and
   a first stack and a second stack, wherein the first stack and the second stack are spaced a predetermined distance apart from each other along a first direction, the at least one magnetic detection element is located between the first stack and the second stack in the first direction, each of the first and second stacks includes a ferromagnetic layer and a first antiferromagnetic layer stacked along a second direction orthogonal to the first direction, the ferromagnetic layer has a first surface and a second surface located at opposite ends in the second direction, the first antiferromagnetic layer is in contact with the first surface of the ferromagnetic layer and exchange-coupled to the ferromagnetic layer, each of the first and second stacks has a first end and a second end opposite to each other in a third direction orthogonal to both of the first direction and the second direction, the first and second stacks are positioned to define an element placement region between the first stack and the second stack when viewed in the second direction, a dimension of the element placement region in the first direction is equal to the distance between the first stack and the second stack, a dimension of the element placement region in the third direction is equal to a dimension of at least one of the first stack or the second stack in the third direction, the element placement region includes a first end region, a second end region and a middle region each of which has an area, the first end region is located closer to the first end of each of the first and second stacks than is the middle region, the second end region is located closer to the second end of each of the first and second stacks than is the middle region, the middle region is located between the first end region and the second end region, borders on the first end region along a first border line parallel to the first direction, and borders on the second end region along a second border line parallel to the first direction, and the at least one magnetic detection element is placed such that an entirety of the at least one magnetic detection element lies within the middle region.

2. The magnetic sensor according to claim 1, wherein a dimension of the first end region in the third direction and a dimension of the second end region in the third direction are both 30% of the distance between the first stack and the second stack.

3. The magnetic sensor according to claim 1, wherein the at least one magnetic detection element is at least one magnetoresistance element.

4. The magnetic sensor according to claim 3, wherein
the at least one magnetoresistance element includes a magnetization pinned layer having a magnetization pinned in a certain direction, a free layer having a magnetization that varies depending on the magnetic field to be detected, and a nonmagnetic layer located between the magnetization pinned layer and the free layer, and the magnetization pinned layer, the nonmagnetic layer and the free layer are stacked along the second direction.

5. The magnetic sensor according to claim 4, wherein the free layer of the at least one magnetoresistance element is located between the ferromagnetic layer of each of the first and second stacks in the first direction.

6. The magnetic sensor according to claim 1, wherein each of the first and second stacks further includes a second antiferromagnetic layer that is in contact with the second surface of the ferromagnetic layer and exchange-coupled to the ferromagnetic layer.

* * * * *